US007518426B1

(12) United States Patent
Smith

(10) Patent No.: US 7,518,426 B1
(45) Date of Patent: Apr. 14, 2009

(54) LOW POWER FLIP-FLOP CIRCUIT AND OPERATION

(75) Inventor: Geoffrey J. Smith, Mt. Gravatt (AU)

(73) Assignee: G2 Microsystems Pty. Ltd., Haymarket (AU)

( * ) Notice: Subject to any disclaimer, the term of this patent is extended or adjusted under 35 U.S.C. 154(b) by 4 days.

(21) Appl. No.: 11/725,047

(22) Filed: Mar. 16, 2007

Related U.S. Application Data

(60) Provisional application No. 60/783,684, filed on Mar. 17, 2006.

(51) Int. Cl.
*H03K 3/356* (2006.01)

(52) U.S. Cl. ...................................... 327/199; 327/203

(58) Field of Classification Search .......... 327/199–207
See application file for complete search history.

(56) References Cited

U.S. PATENT DOCUMENTS

| | | | | |
|---|---|---|---|---|
| 5,617,428 | A * | 4/1997 | Andoh | 714/726 |
| 7,064,594 | B2 * | 6/2006 | Kim | 327/199 |
| 7,183,825 | B2 * | 2/2007 | Padhye et al. | 327/202 |

* cited by examiner

*Primary Examiner*—Dinh T. Le
(74) *Attorney, Agent, or Firm*—Blakely Sokoloff Taylor & Zafman LLP

(57) ABSTRACT

A low power flip-flop circuit and its operation are described. In one example, the circuit includes a clocked gate for producing an output in response to an input when a clock is received, and a clock control circuit to receive the clock and the input, to determine whether the output will be changed by the input and to provide the clock to the clocked gate if the output will be changed by the input.

19 Claims, 4 Drawing Sheets

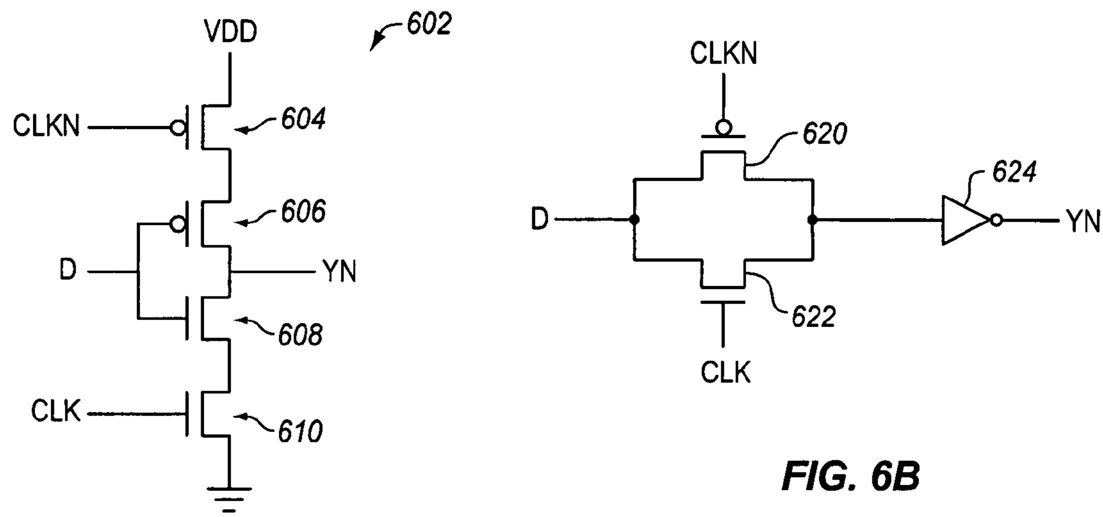
FIG. 6A
FIG. 6B
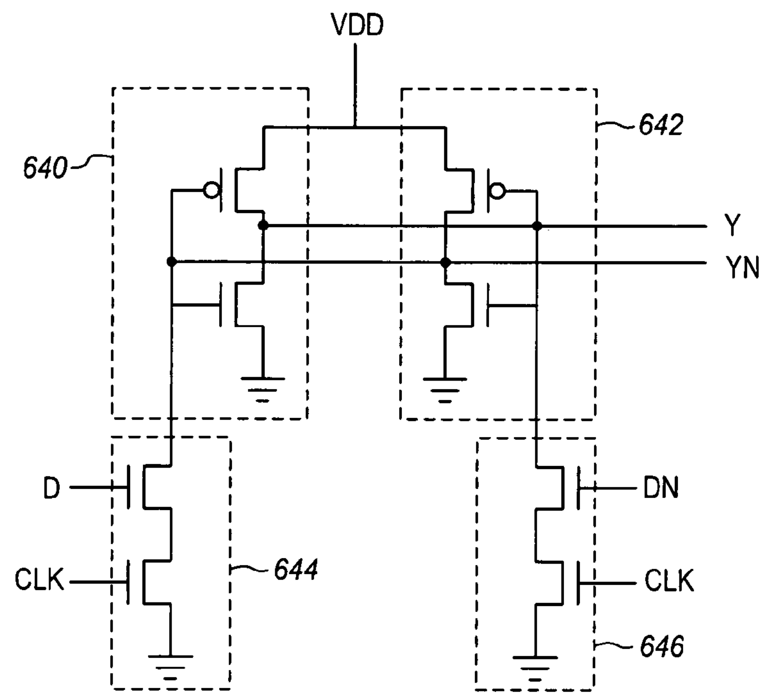
FIG. 6C

LOW POWER FLIP-FLOP CIRCUIT AND OPERATION

CROSS-REFERENCE TO RELATED APPLICATIONS

This application claims the priority of provisional patent application Ser. No. 60/783,684, filed Mar. 17, 2006 entitled Method and Apparatus for Aggregating and Communicating Tracking Information.

BACKGROUND

1. Field

The present description relates to the field of regulating clocked gates in integrated circuits and, in particular, to regulating the clock so that it is supplied to a clocked gate only when needed.

2. Related Art

Flip-flop circuits are widely used in complex electronic systems such as memory, counters, timers, buffers and in a wide range of other applications. A flip-flop circuit, also referred to as a latch or a bistable multivibrator, in a simple form, is an electronic circuit that receives an input (D, T or J) and, in response, produces a stable output voltage (Q) at one of two different output voltages. Since the output voltage is stable and changes only in response to the input, flip-flops have become a common component for one bit of memory. More complex flip-flops may be controlled by two or more control signals, and a gate or clock signal (CLK). The output may include the stable single voltage (Q) and also its complement (QN), i.e. the other voltage.

A simple flip-flop has two cross-coupled inverting elements. These are typically transistors, but may also be implemented as NAND or NOR logic gates. A clocked or strobed flip-flop may also include a gating mechanism, for the gate, clock, or strobe input. A clocked flip-flop only responds to the input value when the gate, clock or strobe signal permits it. This is usually when the gate signal transitions from high to low or from low to high. The flip-flop, whether gated or not, when it receives its input either maintains or changes its output signal. In more complex designs, a master-slave architecture may be used in which two basic flip-flops are combined to reduce the sensitivity to spikes and noise between short clock transitions. Other designs may also include clear (R, reset) or set (S) inputs which may be used to change the current output independent of the clock.

Integrated circuits are usually designed using existing components that are combined together to create the circuit. This avoids the expense and delay of designing standard components each time. For example, to design an ASIC (Application Specific Integrated Circuit), a controller, a DSP (Digital Signal Processor), or other integrated circuit, flows are typically used that synthesize gate level netlists from a high level language such as Verilog HDL (Hardware Description Language). The gate level netlists are usually provided as part of a gate level library provided by a library vendor. The flip-flops in a typical gate level library are normally designed for robust operation in a wide variety of applications and clock scenarios. For some specific applications, the general designs may not be satisfactory.

One specific application for flip-flop circuits is for very low-power circuits. The general flip-flop circuit designs are not normally optimized for low power consumption. Power consumption is normally traded for reliability and speed of operation. Another specific application for flip-flop circuits is in circuits with imprecise clock or gate timing. Standard ASIC flip-flop circuits are designed to fit a clocking methodology that is responsive only to single positive edge clocking. This means that when the voltage of the in put clock signal begins to rise from it low state to its high state, the gate is triggered, activating the flip-flop circuit.

This methodology has the benefit of being very well understood and having extensive support in common computer design tools. However, single positive edge clocking introduces implementation risk around the management of hold times. For reliable operation of a group of such flip-flops, the delivery of the clock to every flip-flop in the design has to be controlled to within a few hundred picoseconds (ps) of clock skew. This may be difficult to ensure with low power, with finer line integrated circuit fabrication processes (e.g. 130 nm and below), and with the introduction of signal integrity issues that are difficult to accurately model.

SUMMARY OF THE DESCRIPTION

A low power flip-flop circuit and its operation are described. In one example, the circuit includes a clocked gate for producing an output in response to an input when a clock is received, and a clock control circuit to receive the clock and the input, to determine whether the output will be changed by the input and to provide the clock to the clocked gate if the output will be changed by the input.

BRIEF DESCRIPTION OF THE DRAWINGS

The invention may be more fully appreciated in connection with the following detailed description taken in conjunction with the accompanying drawings, in which like reference numerals refer to corresponding parts throughout the several views of the drawings, and in which:

FIG. 6A is an example of a tristate latch suitable for use as a latch in the clocked flip-flop circuit of FIG. 2 according to an embodiment of the invention;

FIG. 6B is an example of a transmission gate suitable for use as a latch in the clocked flip-flop circuit of FIG. 5 according to an embodiment of the invention; and FIG. 6C is an example of cross-coupled converters suitable for use as a latch in the clocked flip-flop circuits of FIG. 2 or 5 according to an embodiment of the invention;

DETAILED DESCRIPTION

Figure 1:
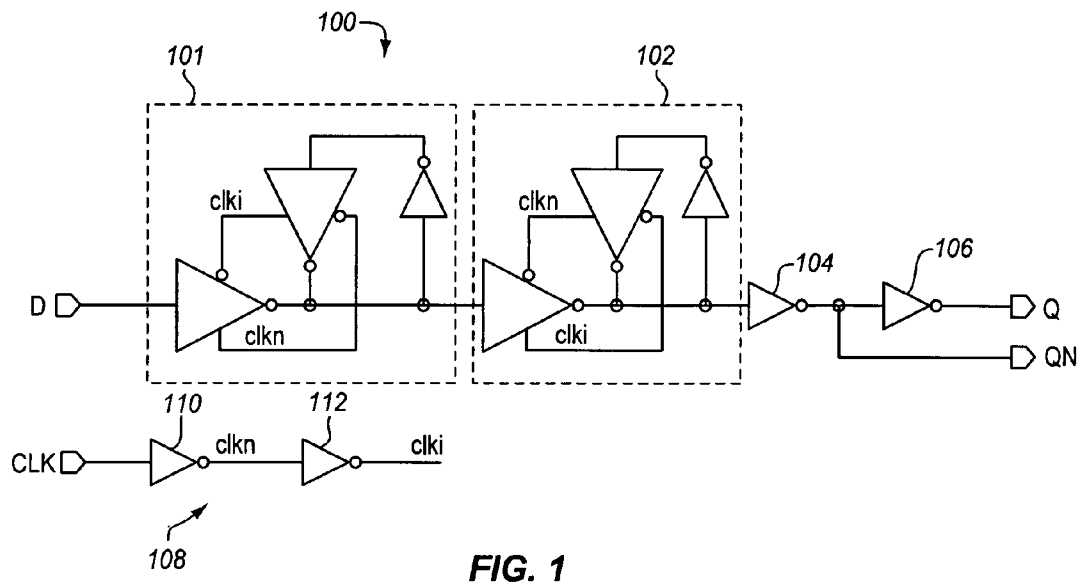
FIG. 1 is a block diagram of a clocked flip-flop circuit.

FIG. 1 shows an example of a typical design for a general D-type flip-flop (DFF) that may be found in a design library. For clarity, optional features such as asynchronous resets, power connections and other inputs are not shown. In addition, the flip-flop is controlled by a clock input (CLK) to a clock circuit 108. The circuitry connecting the clock circuit to the other components is also not shown.

The flip-flop may be abstracted as two latches 101, 102 placed in sequence. When the first latch 101 is open, the second latch 102 is closed, and vice-versa. The first latch has a data input (D) and its output is the data input to the second latch. The output of the second latch is applied to buffered inverters 104, 106 to produce the output (Q). An inverted output (QN) is also provided.

A positive edge flip-flop closes the first latch and opens the second latch when the clock (CLK) is high. This causes it to capture the value on the input (D) at the time the clock went high. Typically, there are sustaining feedback circuits provided on each latch to allow it to maintain its captured value when the clock is low.

The clock circuit that drives the flip-flop typically drives 2 inverters 110, 112 to clean and invert the clock. There are also tri-inverters implementing each latch gate. Each tri-inverter or tri-state gate, in this example would load the clock with two transistor gates. The inverters 110, 112 would normally present two transistor gate loads to the clock. Accordingly, there is a twelve transistor gate load for the clock circuit. The twelve transistor gates loading the clock is a significant percentage of the total number of transistors. Accordingly, the clock circuit consumes a significant amount of the total amount of power consumed by the overall circuit.

Notice that regardless of whether the D input is a different value from the Q output, the clock network of the flip-flop, which consists of 12 transistor gates and the associated wiring, requires power. The consumed power may be estimated at $P=CV^2F$, where P is power, C is capacitance, V is voltage and F is frequency. The frequency of the clock network is, by definition, the fastest frequency in the design and hence the clock network inside the flip-flop consumes a significant amount of power even when the output of the flip-flop (Q) does not change (i.e. D==Q).

In addition, flip-flops that connect to each other normally need to satisfy a hold time criteria. The hold time criteria ensures that the data driven by the rising edge of the driving or first flip-flop in a line does not turn up before the receiving or second flip-flop in the line captures the previously driven information off the same rising edge. The hold time is often provided for using a clock distribution circuit or clock tree to deliver the clock to all the flip-flops. The clock distribution circuit guarantees that the clock edges are delivered to all the flops within a narrow time window. The clock tree itself may have many gates and is also operated at the clock frequency, so that it too consumes a significant amount of power.

A further design issue is that the clock distribution circuit is intended to operate all of the flip-flops in the same narrow timing window. The simultaneous operation creates current peaks when all the flip-flops are switched on and current drops in between the operation of the flip-flops. The large change in current creates large voltage drops in the supply lines. This generates noise, among other ill effects, reducing the margin for other sources of noise. The voltage may be estimated as V=IR, where V is voltage, I is current and R is resistance.

Figure 2:
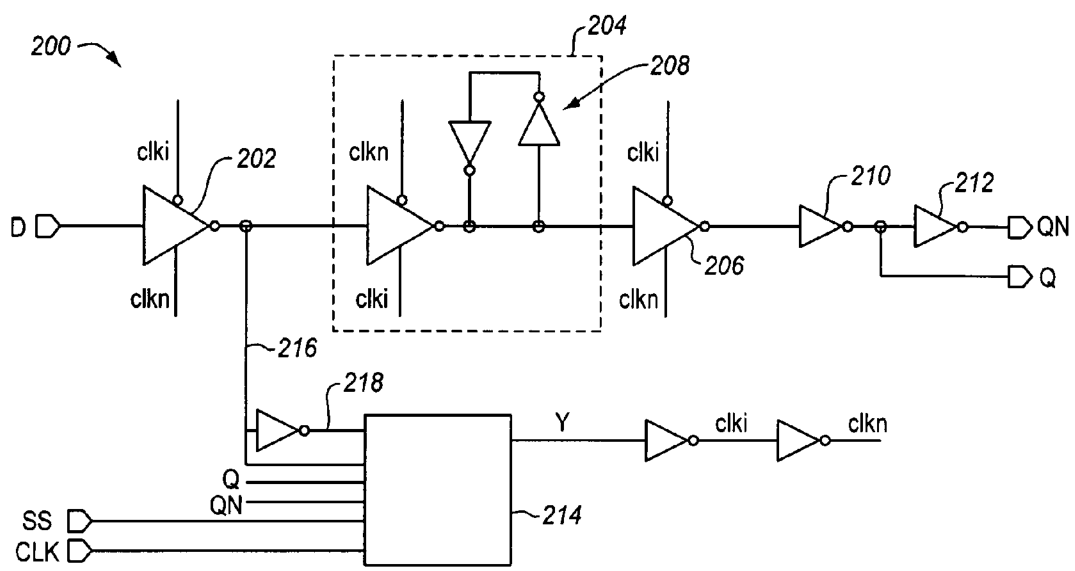
FIG. 2 is a block diagram of a clocked flip-flop circuit with a clock control circuit according to an embodiment of the invention.

An alternative circuit design for a D-type flip-flop is shown in FIG. 2. This circuit reduces power by supporting clocking on demand. In other words, the flip-flops clock input is only applied when it is needed. While there are still twelve transistor gate loads in the clock circuit, the clock network inside the flip-flop is only powered when the state of the output is changed. For the illustrated flip-flop design, this is when the D input does not equal the Q output. (D!=Q). When D==Q, the clock network inside the flip-flop is not fired and energy is saved. If the clock is active 5% of the time, the effective number of transistor gate loads drops from twelve to two and one half.

The amount of energy saved depends upon the activity level of the flip-flop. The flip-flop's activity may be characterized statistically by a net logic activity or a net toggle rate. It is not uncommon for nets to have activity as low as 5%. In other words, 95% of the time D==Q and the state of the flip-flop is not changed. As a result, significant savings are possible if a clock on demand flip-flop reduces the clock activity rate of the flip-flop to 5% of the normal activity rate.

Referring to FIG. 2, a flip-flop circuit 200 has three latches 202, 204, 206 in series or sequence. The output of the first and second latches are the inputs of the second and third latches, respectively. The additional latch 206 is added to the output stage. As explained below, the extra latch provides for skew safe clocking.

The circuit further includes an output buffer 210 coupled to the output of the third stage, and an inverter 212 coupled to the output of the buffer. With the inverter 212, the output (Q) of the flip-flop circuit and its inverse (QN) are presented.

The second latch includes conventional sustaining circuits 208, but these are not included for the first 202 and third 206 latches. These may be removed without consequence if clocking can be contained so that the clock input (clk) is zero when the clocking is disabled. In addition, the sustaining circuit on the second latch is in the form of a long-channel resistive device, in this case two inverters coupled together in series, that start and end on the output of the latch gate, instead of a clocked device. As a result, the second latch does not present a load to the clock network.

In the example of FIG. 2, the input clock (CLK) is driven into a complex logic gate 214 and not directly into the first latch. The complex logic gate provides the clock inputs (clki, clkn) into the latches. This allows the logic gate to control whether the clock inputs are supplied. The complex logic gate also receives the output 216 and its inverse 218 from the first stage 202, and the circuit output (Q) and its inverse (QN). Of course, the inverses may be determined within the logic gate, rather than being applied as external inputs. The complex logic gate implements a function that may be described as:

$$Y=!((D!=Q)+SS).CLK$$

In other words, while SS is low, the flip-flop clock network provides an inverted clock if and only if D!=Q. SS refers to a skew safe control signal, described in more detail below. As a result, if D==Q the main clock only sees a load of 2 transistor gates, compared to 12 transistor gate loads when D!=Q. The skew safe control signal (SS) allows logic gate function to be turned off so that the flip-flop circuit is used normally, clocking all the time. In this mode, the extra latch 206 provides for a significant hold time margin. The SS control signal may be tied at design time or may be changed while the circuit is operating depending on the mode of operation of the whole integrated circuit.

A power saving mode is enabled when the SS signal is set to 0. If Skew Safe clocking is enabled, (SS=1) then the flip-flop circuit operates normally and so it is clocking continuously. However, the extra latch 206 allows for hold time to be traded against setup time constraints. Based on the above, when SS=1, the third latch 206 does not drive the output until the falling edge of the clock while the data input is captured on the rising edge. The hold time is therefore dependent on the high time pulse width of the clock. This allows hold time constraints to be traded against setup time constraints by a simple variation of the clock pulse width.

One example of ample setup time and difficult hold time constraints is when the flip-flop circuit is used as a shift register, for example in scan test scenarios.

The SS signal allows the flip-flop to be switched from a low power flip-flop in normal mode to a flip-flop that is clock skew safe in test mode. This selection can either be made at design time by tying the SS pin high or low or at run time, by tying the SS pin to a mode signal. The mode signal can be changed from high to low, depending on the desired operation of the device.

TABLE 1

| | |
|---|---|
| 5.0% | 12 Transistor gate loads |
| 95.0% | 2 Transistor gate loads |
| 100.0% | 2.5 Transistor gate loads (average) |
| | 79.2% Power savings |

Table 1 shows power savings that are possible with a 5% toggle rate. The actual power saving will depend on the actual toggle rate of the net to which the D input of the flip-flop is attached. If D!=Q 20% of the time, then the internal flip-flop power saved is theoretically 66.7%. If D!=Q 5% of the time, as in Table 1, then the power saved is 79.2%. With 12 transistor gate loads powered 5% of the time and 2 transistor gate loads powered the other 95% of the time, the average load is 2.5 transistor gates. This amounts to the indicated theoretical 79.2% power savings.

TABLE 2

| | | |
|---|---|---|
| FIG. 1 DFF | 15.49 μA | |
| FIG. 2 DFF (SS = 0) | 3.67 μA | 76.3% Power savings |
| FIG. 2 DFF (SS = 1) | 22.93 μA | 48.03% Power increase |
| | 83.99% Power savings SS = 0 over SS = 1 | |

The flip-flop circuit described in FIG. 2 has been laid out and simulated. The simulated power savings, taking into account real issues like the additional power consumption of the complex logic gate, leakage current and other factors, has been measured to be 76.3% against a conventional flip-flop design.

This is described in Table 2 in terms of current consumption. A typical DFF of the type shown in FIG. 1 consumes about 15 microamperes (μA). The DFF in FIG. 2 consumes more power when the complex logic gate and associated clocking circuitry is active, about 23 μA, but much less power when the logic gate and associated clocking circuitry is not active, about 4 μA. For the 5% duty cycle sample of Table 1, the average current is about 4.6 μA, which provides about a 70% reduction in power consumption.

Figure 3:
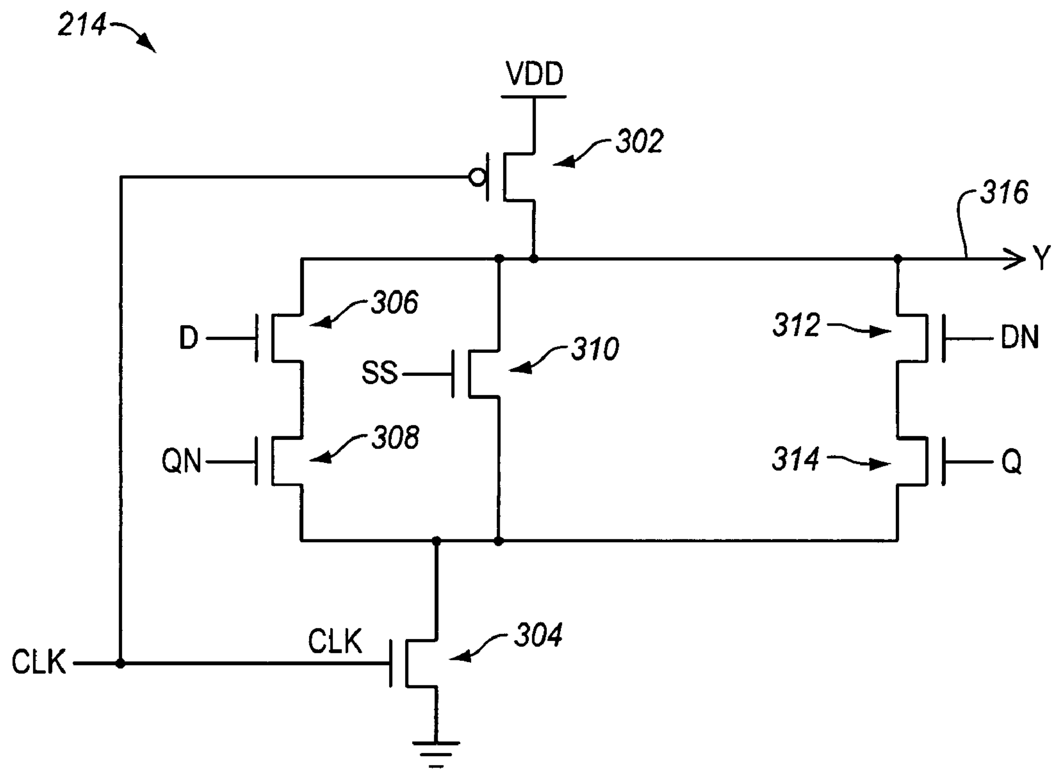
FIG. 3 is a block diagram of a clock control circuit suitable for use in the circuit of FIG. 2 according to an embodiment of the invention.

FIG. 3 shows an example of a complex logic gate 214, in this case complex domino logic, suitable for application to the flip-flop circuit described above. In the example of FIG. 3, the logic gate has all of the inputs described above, data (D) and its inverse (DN), output (Q) and its inverse (QN), clock (CLK) and the skew safe signal (SS). These are all applied to the gates of interconnected MOSFETs (Metal Oxide Semiconductor Field Effect Transistor) as shown in FIG. 3. While the diagram is drawn with MOSFETs other types or a mix of types of components may be used instead. A first pair of transistors is coupled between the power supply and the logic network. A p-type transistor 302 has a source coupled to the input voltage VDD and an n-type transistor 304 has its drain coupled to ground. The gates of both are coupled to the clock input, so that the complex logic gate is powered only when the clock is high.

The input voltage is applied through the supply transistor 302 to a pair of transistors aligned in series with their drains coupled to the ground transistor 304. One transistor 306 of the pair is controlled by the data (D) input and the other 308 is controlled by the inverse of the flip-flop output (QN). Accordingly, when D is high and QN is high this pair of transistors will allow the clock output (Y) 316 to be pulled low. A second pair of transistors in parallel with the first pair has a first transistor 312 controlled by the inverse of the data (DN) and a second transistor 314 in series with the first that is controlled by the flip-flop output (Q). This pair will pull the clock output (Y) low when DN and Q are both high.

This combination of pairs functions so that during a clock signal, the clock is enabled whenever D and Q are not equal. As described above, the effect of the complex logic gate is that, the clock signal to the flip-flop is only active when the external clock is high and the state of the flip-flop is to be changed. If the external clock is not active, then the clock circuit is shut off. In addition, if the input data D is the same as the output data Q, then the clock circuit stays shut down.

The final input SS to the complex logic gate is applied to another transistor that is in parallel with the two pairs of transistors discussed above. When SS is high, then the clock signal is enabled notwithstanding the state of D and Q. When SS is low, then the clock signal is enabled only when D and Q are not equal. SS, accordingly acts to turn the complex logic gate on or off. As mentioned above, SS may be tied during the design phase to one state or another, or it may be set by software or a firmware process. Alternatively, it may be left out completely.

The particular example of FIG. 3 is provided only as an example. There are many different ways to construct a complex logic gate that performs the functions mentioned above. The logic gate may be modified to perform additional functions, respond to additional inputs or to control the clock signal to more than one flip-flop circuit. The logic gate may also be combined with the clock distribution network or another component of the system.

Figure 4:
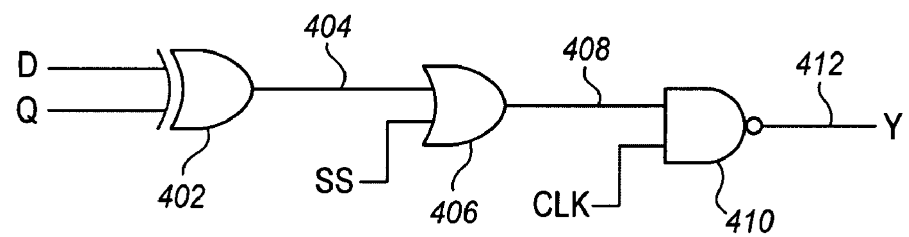
FIG. 4 is a block diagram of an alternative clock control circuit suitable for use in the circuit of FIG. 2 according to an embodiment of the invention.

One such alternative design is shown in the diagram of FIG. 4. The example of FIG. 4 uses simple static logic gates. The D and Q signals are fed directly to the inputs of an XOR (Exclusive OR) gate 402. When the two inputs are different, the XOR output 404 will be high. The XOR output 404 is applied to an input of an OR gate 406. The other input is the SS signal. If either of these inputs is high, then the OR output 408 is high. This is applied then to a NAND gate 410. The other input of the NAND gate is the clock. The output 412 of the NAND gate y may be applied to the circuit of FIG. 2 in the same way as the y output of the circuit of FIG. 3 to achieve the same result.

Figure 5:
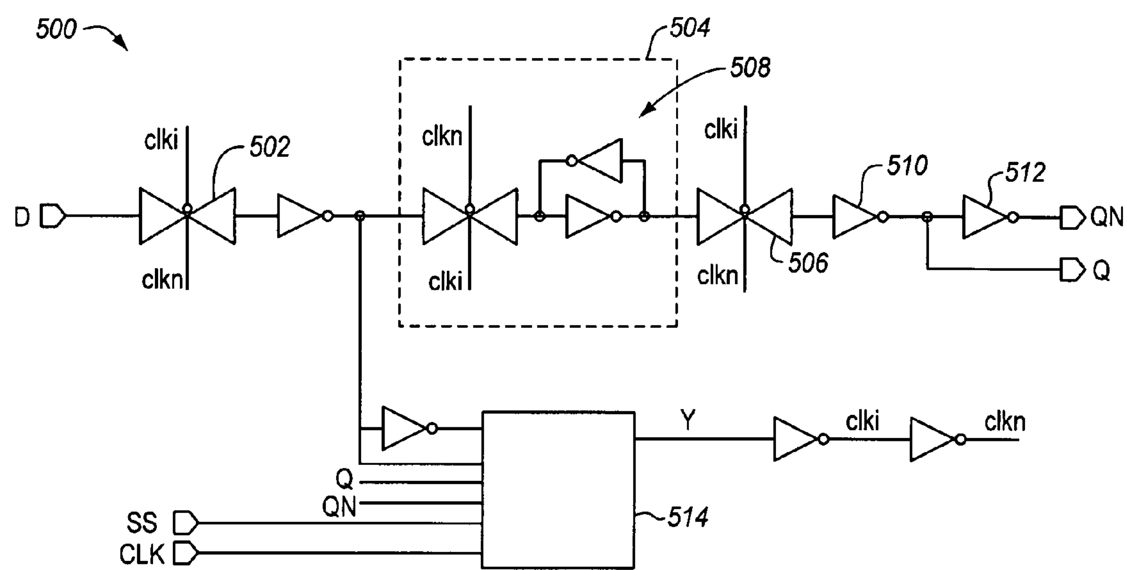
FIG. 5 is a block diagram of an alternative clocked flip-flop circuit with a clock control circuit according to an embodiment of the invention.

As with FIG. 3, a number of variations may be applied to the circuit of FIG. 2, depending on the particular implementation. FIG. 5 shows a variation on FIG. 2 in which the tristate latches 202, 204, 206 are replaced with transmission gates 502, 504, 506 and inverters, as appropriate. In the example of FIG. 5, a flip-flop circuit 500 presents the three latches 502, 504, 506 in sequence. An output buffer 510 is coupled to the output of the third stage 508, and an inverter 512 is coupled to the output of the buffer to produce the output (Q) and its inverse (QN).

As in FIG. 2, the second latch 504 includes conventional sustaining circuits 508, that are not provided for the first and third latches. The input clock (CLK) is driven into a complex logic gate 514 as described above with respect to FIGS. 3 and 4 to provide the clock inputs (clki, clkn) into the latches. The circuit of FIG. 5 operates similarly to that of FIG. 2.

A variety of different devices may be used as the latches for a flip-flop of the type shown in FIGS. 2 and 5. The tristate latch of FIG. 2 and transmission gate of FIG. 5 are just two examples. FIG. 6A shows an example implementation of a tristate latch 602 suitable for use in the example of FIG. 2. In this example, four MOSFET transistors are connected in series between a power supply Vdd and ground. The top two 604, 606 are p-type and the bottom two 608, 610 are n-type. The top 604 and bottom 610 gates are tied to the inverse clock and the clock, respectively. The middle two 606, 608 gates are both tied to the D input. The output, yn, is taken between the drain and source of the middle two transistors when the clock is pulsed.

FIG. 6B shows an example implementation of a transmission gate suitable for the example flip-flop of FIG. 5. In FIG. 6B, two MOSFETS are connected in parallel. The upper transistor 620 is p-type and the lower transistor is n-type. The inverse clock and clock are tied to the gates of the top and bottom transistors, respectively. The D input is applied to the common source of the two parallel transistors and the result, yn, is obtained at the common drain is applied first to an inverter 624. The inverter output y is taken as the latch output.

FIG. 6C shows a pair of cross-coupled inverters 640, 642 as another approach to the latch of FIGS. 2 and 5. In FIG. 6C, the left side inverter 640 receives the D input from a clocked input circuit 644. The right side inverter 642 receives the inverse D input from a second clocked input circuit 646. The inverters are cross coupled so that the output of each one is applied to the input of the other together with the D or inverse D input. The outputs are also taken as the latch output, y, and its inverse, yn.

A lesser or more equipped logic gate design, clocking system, flip-flop circuit, clock control circuit, and transistor structure than the examples described above may be preferred for certain implementations. Therefore, the configurations will vary from implementation to implementation depending upon numerous factors, such as price constraints, performance requirements, technological improvements, or other circumstances. The particular nature of the circuit designs and any attached devices may be adapted to the intended use of the device. Any one or more of the devices, interfaces, inputs, outputs or discrete components may be eliminated from this system and others may be added. For example, the clock control circuit may be distributed for application to several different flip-flops. Similarly a clock distribution network may be used to provide clocking to more than one flip-flop. More or fewer buffers may be used and more or fewer sustaining circuits of different kinds may be used.

While embodiments of the invention have been described in the context of a reduced power flip-flop, the approaches and techniques described here may be applied to a wide variety of different contexts in which power consumption is to be reduced including a logic gate and propagated signal environments. In addition, embodiments of the invention may be applied to massively parallel arrays of flip-flops in the form of memory banks and similar circuits.

In the description above, for purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods and apparatus are described in their most basic form but steps may be added to or deleted from any of the methods and components may be added or subtracted from any of the described apparatus without departing from the basic scope of the present invention. Many further modifications and adaptations may be made. The particular embodiments are not provided to limit the invention but to illustrate it.

What is claimed is:

1. An apparatus comprising:

a clocked gate for producing an output in response to an input when a clock is received; and a clock control circuit to receive the clock and the input, to determine whether the output will be changed by the input and to provide the clock to the clocked gate if the output will be changed by the input, wherein the clocked gate comprises a series of clocked latches, each coupled to the clock to produce an output to the next latch in the series when the clock is received.

2. The apparatus of claim 1, wherein the clocked gate is a memory cell, the input is the value to be stored and the output is the value that is stored.

3. The apparatus of claim 1, wherein the clocked gate is a flip-flop circuit.

4. The apparatus of claim 1, wherein the clock control circuit determines whether the output will be changed by comparing a current output to the input.

5. The apparatus of claim 1, wherein the clock control circuit provides the clock if the output is different from the input.

6. The apparatus of claim 1, wherein the clock control circuit is a logic device to provide the clock when the input is not equal to the output and the clock is active.

7. The apparatus of claim 1, wherein the clock control circuit receives a mode control signal that, when asserted, sets the clock control circuit to provide the clock regardless of the input.

8. The apparatus of claim 1, wherein the series includes three clocked latches and wherein the intermediate clocked latch includes self-sustaining circuitry.

9. The apparatus of claim 1, wherein the first and second latches capture the input on a rising edge of a clock pulse of the received clock and the third latch generates the output on a falling edge of the same clock pulse.

10. The apparatus of claim 1, further comprising a control signal input coupled to the clock control circuit to alternately enable and disable the clock control circuit.

11. A method comprising:

comparing an input to a storage cell to an output state of a storage cell;

determining whether an output of the storage cell will be changed by the input to the storage cell;

providing a clock to the storage cell if the output will be changed by the input;

receiving the clock and the input at the storage cell; and producing the output at the storage cell in response to the input when the clock is received at the storage cell, wherein providing the clock comprises providing the clock through a series of clocked latches, each coupled to the clock to produce an output to the next latch in the series when the clock is received.

12. The method of claim 11, wherein the storage cell is a memory cell, the input is the value to be stored and the output is the value that is stored.

13. The method of claim 11, wherein determining whether an output will be changed comprises determining if the output is different from the input.

14. The method of claim 11, further comprising receiving a mode control signal and, when the mode control signal is asserted, providing the clock regardless of the input.

15. The method of claim 11, further comprising disabling the series of clocked latches when a control signal input is received.

16. The method of claim 11, wherein providing the clock through a series of clocked latches comprises providing the clock if the output is different from the input.

17. An apparatus comprising:

means for comparing an input to a storage cell to an output state of a storage cell;

means for determining whether an output of the storage cell will be changed by the input to the storage cell;

means for providing a clock to the storage cell if the output will be changed by the input;

means for receiving the clock and the input at the storage cell; and means for producing the output at the storage cell in response to the input when the clock is received at the storage cell, wherein the means for providing the clock comprises means for latching the clock through a series of delays, each latch coupled to the clock to produce an output to the next latch in the series when the clock is received.

18. The apparatus of claim 17, wherein the means for determining whether the output will be changed comprises means for determining if the output is different from the input.

19. The apparatus of claim 17, further comprising means for receiving a mode control signal and, when the mode control signal is asserted, means for providing the clock regardless of the input.

* * * * *